(12) United States Patent
Ju et al.

(10) Patent No.: US 8,249,737 B2
(45) Date of Patent: Aug. 21, 2012

(54) RAPID THERMAL ANNEALING METHOD FOR A SEMICONDUCTOR DEVICE

(75) Inventors: Jianhua Ju, Shanghai (CN); Xianjie Ning, Shanghai (CN)

(73) Assignee: Semiconductor Manufacturing International (Shanghai) Corp., Shanghai (CN)

( * ) Notice: Subject to any disclaimer, the term of this patent is extended or adjusted under 35 U.S.C. 154(b) by 284 days.

(21) Appl. No.: 12/708,469

(22) Filed: Feb. 18, 2010

(65) Prior Publication Data

US 2011/0066270 A1 Mar. 17, 2011

(30) Foreign Application Priority Data

Sep. 17, 2009 (CN) .......................... 2009 1 0195955

(51) Int. Cl.
*G06F 19/00* (2011.01)
(52) U.S. Cl. ........ 700/121; 700/103; 438/275; 438/295; 257/295
(58) Field of Classification Search .................. 700/121, 700/103; 438/275, 295; 257/295
See application file for complete search history.

(56) References Cited

U.S. PATENT DOCUMENTS

| | | | |
|---|---|---|---|
| 6,403,432 B1* | 6/2002 | Yu et al. | 438/296 |
| 6,420,232 B1* | 7/2002 | Wu | 438/257 |
| 6,605,506 B2* | 8/2003 | Wu | 438/257 |
| 6,914,013 B2* | 7/2005 | Chung | 438/770 |
| 7,884,406 B2* | 2/2011 | Wang | 257/295 |
| 2002/0102793 A1* | 8/2002 | Wu | 438/257 |
| 2003/0201491 A1* | 10/2003 | Chung | 257/324 |

* cited by examiner

*Primary Examiner* — Ramesh Patel
*Assistant Examiner* — Anthony Whittington
(74) *Attorney, Agent, or Firm* — Squire Sanders US) LLP

(57) ABSTRACT

The present invention discloses a rapid thermal annealing method for a semiconductor device, which includes the steps of: establishing a ternary correspondence relationship among a device electrical parameter, an annealing temperature, and an STI distribution density; deriving an STI distribution density in a specific area of the semiconductor device and a target STI distribution density; determining whether the STI distribution density in the specific area is larger than the target STI distribution density; if the STI distribution density in the specific area is larger than the target STI distribution density, adding a virtual structure in the specific area to make the STI distribution density in the specific area equal to the target STI distribution density; and deriving from the ternary correspondence relationship a target annealing temperature corresponding to the target STI distribution density and performing an annealing process with the annealing temperature on the semiconductor device to achieve a target electrical parameter. The method can alleviate the phenomenon of temperature non-uniformity of a rapid thermal annealing process so as to avoid any influence thereof upon the electrical performance of the semiconductor device.

9 Claims, 4 Drawing Sheets

RAPID THERMAL ANNEALING METHOD FOR A SEMICONDUCTOR DEVICE

FIELD OF THE INVENTION

The present invention relates to the field of semiconductor manufacturing technologies and in particular to a rapid thermal annealing method for a semiconductor device.

BACKGROUND OF THE INVENTION

A Rapid Thermal Annealing (RTA) is a thermal handling process for a short time at a high temperature. Typically, a wafer is placed onto a quartz stand within a process cavity and heated using a light source with high intensity. In a manufacturing process of an advanced integrated circuit, the RTA has been widely applied to procedures of thermal activation of implanted impurities, formation of metal silicide, etc.

Integrated circuit manufacturing technologies generally fabricate repeatedly arranged plural chips on a wafer simultaneously. For a product with plural chips, thermal budgets for the chips may vary because their semiconductor structures differ for their respective application scenarios. Therefore, an improvement of uniformity of an RTA process has been a technical issue under study in the industry.

For example, both an active area and a gate in a radio frequency circuit chip are distributed at a low density, and an active area or a gate in an SRAM circuit chip is distributed at a large density. On the other hand, areas with different distribution densities of an active area or a gate may be present even in the same chip. Such a difference of distribution densities of semiconductor structures, e.g., an active area, a gate, etc., may result in a difference of local temperatures in a wafer subject to a rapid thermal annealing process, thereby influencing uniformity of the process.

There is disclosed in Chinese Patent Publication No. 101454870A a method for providing a uniform temperature in a defined area across a wafer during a rapid thermal annealing process, which includes determining a first reflective index in a first part of the defined area by measuring the density of a first structure in the first part. Next, the method determines a second reflective index in a second part of the defined area by measuring the density of a second structure in the first part. Specifically, the first structure includes a diffusive dummy shape and a poly-silicon conductive dummy shape (non-active pseudo structure), and the second structure includes an active circuit structure. Then, the first reflective index and the second reflective index are compared and balanced through adjusting the amount by which the diffusive dummy shape and the poly-silicon conductive dummy shape in the first structure overlap. However, this method is simply based upon the balance between the different areas in the wafer but is not linked with consistency of electrical performance of a semiconductor device throughout the wafer.

The phenomenon of temperature non-uniformity of a rapid thermal annealing process may influence directly the electrical performance of a semiconductor device in an integrated circuit, so that a parameter, e.g., a threshold voltage, a saturation current, etc., of the device in a local area may fail to reach a target value.

SUMMARY OF THE INVENTION

A problem to be addressed by the invention is how to alleviate the phenomenon of temperature non-uniformity of a rapid thermal annealing process so as to avoid any influence thereof upon the electrical performance of a semiconductor device.

In order to address the foregoing problem, an embodiment of the invention provides a rapid thermal annealing method for a semiconductor device, which includes the steps of:

establishing a ternary correspondence relationship among an device electrical parameter, an annealing temperature, and an STI distribution density;

deriving an STI distribution density in a specific area of the semiconductor device and a target STI distribution density;

determining whether the STI distribution density in the specific area is larger than the target STI distribution density;

if the STI distribution density in the specific area is larger than the target STI distribution density, adding a virtual structure in the specific area to make the STI distribution density in the specific area equal to the target STI distribution density; and deriving from the ternary correspondence relationship a target annealing temperature corresponding to the target STI distribution density and performing an annealing process with the annealing temperature on the semiconductor device to achieve a target electrical parameter.

The derivation of the STI distribution density in the specific area includes the steps of:

pre-dividing the semiconductor device into a plurality of repeated specific areas;

detecting the active area distribution density $A_x$ and the gate distribution density $P_x$ in each of the specific areas; and calculating the STI distribution density $D_x$ by the equation of $D_x=(1-A_x)\times(1-P_x)$.

The virtual structure includes at least a virtual active area and a virtual gate.

The addition of the virtual structure in the specific area includes the steps of:

determining whether the active area distribution density in the specific area is smaller than a target active area distribution density;

if the active area distribution density in the specific area is smaller than the target active area distribution density, adding a virtual active area in the specific area; otherwise, determining whether the gate distribution density in the specific area is smaller than a target gate distribution density; and if the gate distribution density in the specific area is smaller than the target gate distribution density, adding a virtual gate in the specific area.

The addition of the virtual structure in the specific area includes the steps of:

determining whether the gate distribution density in the specific area is smaller than a target gate distribution density;

if the gate distribution density in the specific area is smaller than the target gate distribution density, adding a virtual gate in the specific area; otherwise, determining whether the active area distribution density in the specific area is smaller than a target active area distribution density; and if the active area distribution density in the specific area is smaller than the target active area distribution density, adding a virtual active area in the specific area.

The derivation of the target STI distribution density in the specific area of the semiconductor device includes the steps of:

determining the target electrical parameter according to a design demand for the semiconductor device; and deriving, from the ternary correspondence relationship among the electrical parameter, the annealing temperature, and the STI distribution density, the target STI distribution density corresponding to the target electrical parameter.

The electrical parameter includes a saturation current or a threshold voltage.

The annealing temperature is a peak annealing temperature.

The ternary correspondence relationship among the element electrical parameter, the annealing temperature, and the STI distribution density is a linear relationship.

The addition of the virtual structure includes increasing the pattern number of virtual structures or the pattern area of an original virtual structure.

The foregoing technical solutions have the following advantages over the prior art.

With the rapid thermal annealing method for a semiconductor device according to the invention, the ternary correspondence relationship among the device electrical parameter, the annealing temperature, and the STI distribution density is established, firstly. Then, the concept of the STI distribution density is introduced to reflect the non-uniformity condition of an actual annealing process temperature of the semiconductor device throughout the wafer. Subsequently, a virtual structure is added in a specific area where the STI distribution density is larger than the target STI distribution density to thereby make the STI distribution density in the specific area equal to the target STI distribution density. From the ternary correspondence relationship, the target annealing temperature corresponding to the target STI distribution density is derived, and an annealing process is performed with the annealing temperature to thereby achieve the target electrical parameter. Thus, the same target STI distribution density in respective areas of the semiconductor device throughout the wafer can be ensured. Equivalently, substantially consistent absorptivity (or reflectivity or transmissivity) of the respective areas with respect to RTA radiation can be ensured. Therefore, a uniform actual RTA process temperature is achieved. Further, a uniform target electrical parameter is achieved. Therefore, the phenomenon of temperature non-uniformity of the rapid thermal annealing process can be improved to avoid any influence thereof upon the electrical performance of the semiconductor device.

BRIEF DESCRIPTION OF THE DRAWINGS

The foregoing and other objects, features and advantages will become more apparent from the drawings throughout which the same reference numerals denote the same components and which have not been presented purposely to scale according to actual dimensions but are intended to highlight the gist of the invention. In the drawings.

DETAILED DESCRIPTION OF THE INVENTION

Figure 1:
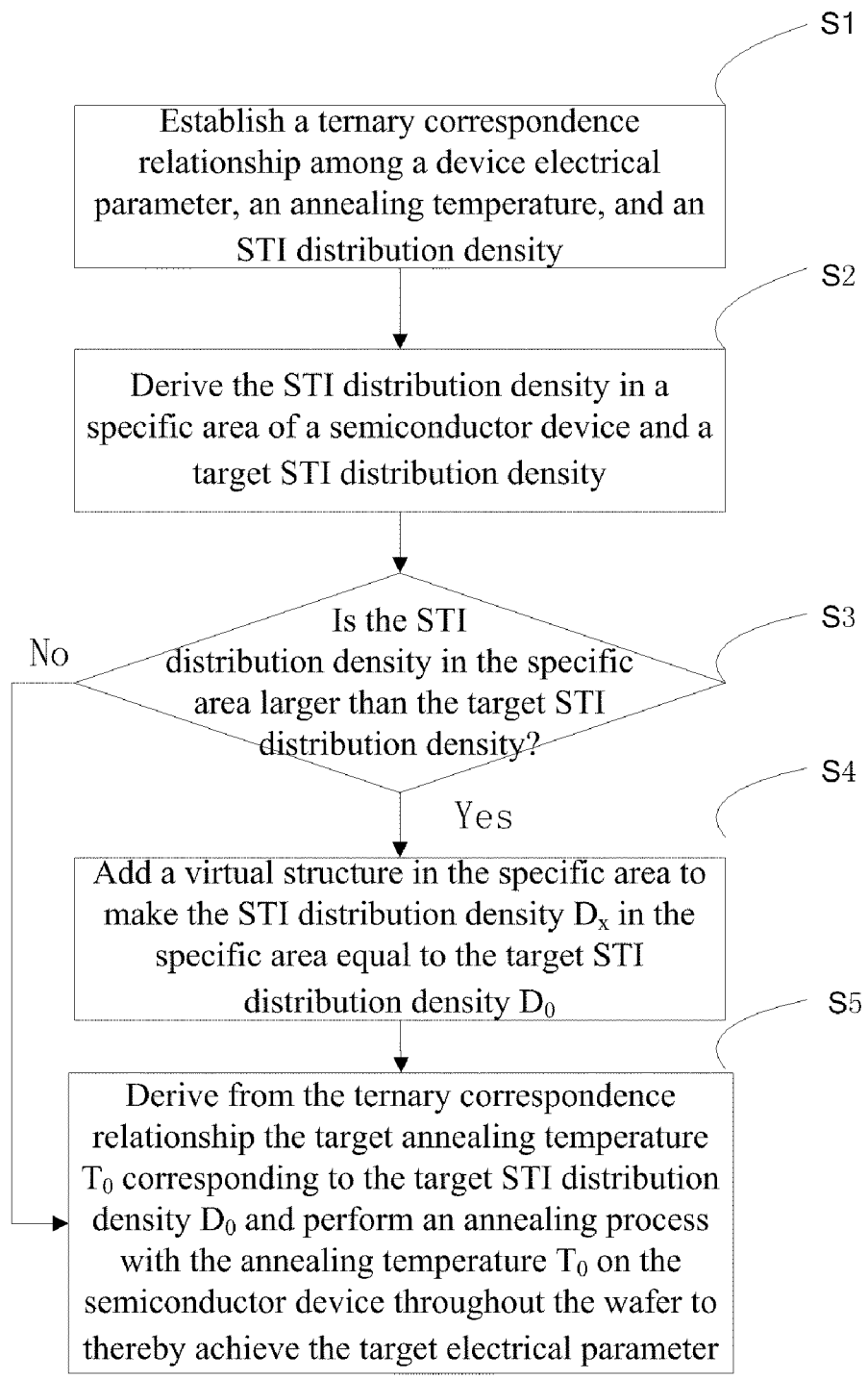
FIG. 1 is a flow chart illustrating a rapid thermal annealing method for a semiconductor device according to an embodiment of the invention.

Embodiments of the invention will be detailed below with reference to the drawings to make the foregoing objects, features and advantages of the invention more apparent.

Numerous specific details will be set forth in the following description to facilitate understanding of the invention, but the invention can also be put into practice in different embodiments from those described here, and the skilled in the art can make generalization thereof without departing from the spirit of the invention. Therefore, the invention will not be limited to the embodiments disclosed below. A "semiconductor device" as referred to in the context generally refers to plural integrated circuit chips (dies) on a wafer.

Secondly, the invention will be detailed with reference to the drawings. For convenient descriptions, a sectional view illustrative of the structure of a device will be magnified but not to scale, and the schematic diagrams are merely illustrative but not intended here to limit the scope of the invention. Moreover, three-dimension spatial dimensions of length, width and depth will be involved during actual fabrication.

In a traditional manufacturing process of an integrated circuit, the phenomenon of temperature non-uniformity of a rapid thermal annealing process may influence directly the electrical performance of a semiconductor device in an integrated circuit, so that a parameter, e.g., a threshold voltage, a saturation current, etc., of the device in a local area may fail to reach a target value.

The inventors have appreciated from a study that, since the RTA process adopts radiant heating from a light source with high intensity (simply referred to as RTA radiation), the foregoing phenomenon of temperature non-uniformity is related to absorption and reflection of the RTA radiation by various semiconductor structures of a semiconductor device on a wafer. For example, in an RTA process for thermal activation of a source/drain area or formation of metal silicide, an Active Area (AA) and a gate (Ploy) tend to reflect the RTA radiation, and a Shallow Trench Isolation (STI) tends to absorb the RTA radiation.

In different semiconductor devices or the same semiconductor device on a wafer, semiconductor structures, e.g., an active area, a gate, a shallow trench isolation, etc., are typically distributed in different areas at densities varying with different design demands for a product. Thus, given the same annealing temperature of RTA radiation, the wafer is at a relatively low temperature in an area where the AA and the Ploy are at a high density and the STI is at a low density due to high reflectivity, and on the contrary, it is at a relatively high temperature in an area where the AA and the Ploy are at a low density and the STI is at a high density due to high absorptivity, thus giving rise to non-uniformity of an actual handling temperature of the semiconductor device on the wafer.

The inventors have further appreciated from the study that an objective correspondence relationship is present among the distribution density of the STI, a device electrical parameter of the semiconductor device, and an annealing temperature of RTA radiation. Actually, the distribution density of the STI is complementary to those of the AA and the Ploy. In view of this, the invention has inventively introduced the concept of the distribution density of the STI, so that the distribution density of the STI reflects the distribution densities of the AA and the Ploy. Uniformity of the distribution density of the STI is adjusted for a target electrical parameter according to the objective correspondence relationship present among the distribution density of the STI, the device electrical parameter, and the annealing temperature, thereby improving uniformity of the RTA process.

An embodiment of the rapid thermal annealing method for a semiconductor device according to the invention will be detailed below with reference to the drawings.

Figure 2:
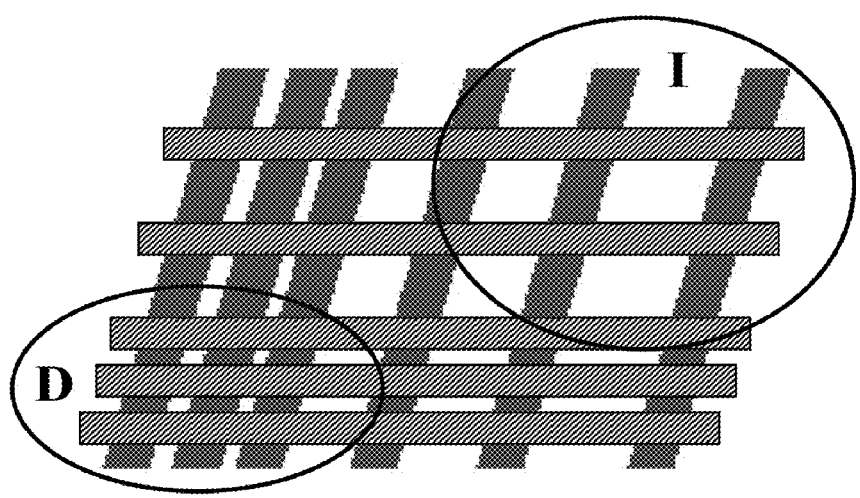
FIG. 2 is a schematic diagram illustrating a local structure of a semiconductor device according to an embodiment of the invention.
Figure 3:
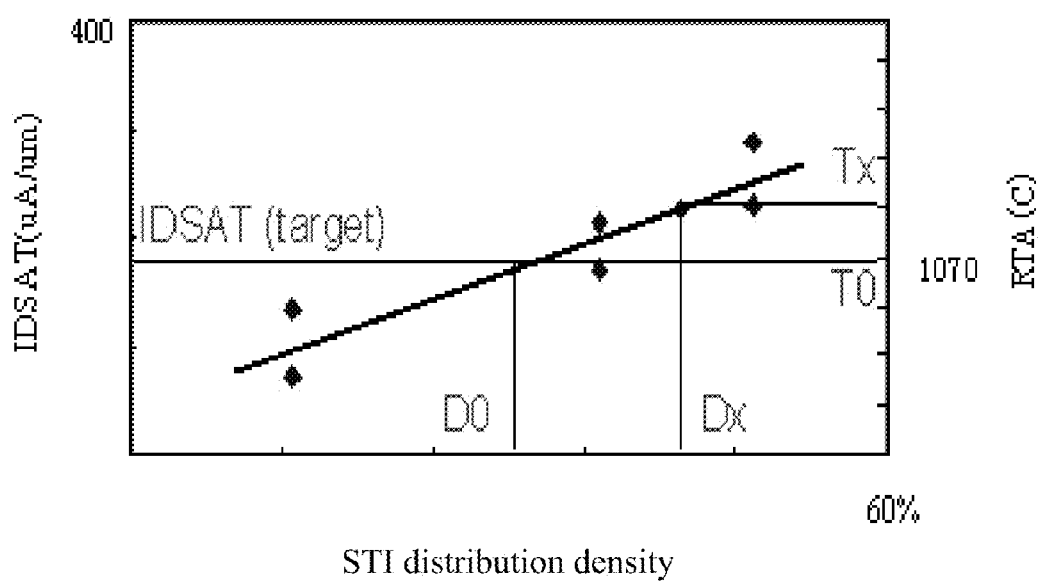
FIG. 3 is a plot illustrating a correspondence relationship among a saturation current, an annealing temperature, and an STI distribution density according to an embodiment of the invention.

FIG. 1 is a flow chart illustrating a rapid thermal annealing method for a semiconductor device according to the embodiment, FIG. 2 is a schematic diagram illustrating a local structure of the semiconductor device according to the embodiment, and FIG. 3 is a plot illustrating a correspondence relationship among a saturation current $I_{dsat}$, an annealing temperature, and the distribution density of the STI according to the embodiment.

As illustrated in FIG. 1, the rapid thermal annealing method for a semiconductor device includes the following steps.

Step S1: A ternary correspondence relationship among a device electrical parameter, an annealing temperature, and an STI distribution density is established.

Specifically, the inventors have appreciated from the study that an objective ternary correspondence relationship is present among the electrical parameter of a semiconductor device, the annealing temperature, and the STI distribution density, as mentioned above. Therefore, a database of the relationship among the electrical parameter, the annealing temperature, and the STI distribution density can be pre-established, and a plot illustrating the ternary correspondence relationship can be simulated as illustrated in FIG. 3 according to the database.

Referring to FIG. 3, the inventors have appreciated from the study that there is a linear correspondence relationship among a device saturation current $I_{dsat}$, the annealing temperature of RTA radiation, and the STI distribution density of the semiconductor device. With illustration of only a few embodiments in the plot, the left ordinate axis represents the saturation current $I_{dsat}$, the right ordinate axis represents the annealing temperature of RTA radiation, e.g., a peak temperature, and the abscissa axis represents the STI distribution density, where the three are in a substantially linear relationship.

Thus, a corresponding annealing temperature $T_0$ of RTA radiation (simply referred to as the annealing temperature) can be adopted for the semiconductor device with a specific STI distribution density $D_0$ to thereby achieve a target saturation current value in compliance with a design demand, thus ensuring reliability of an RTA process.

However, this relates to an ideal situation. In practice, semiconductor devices may have different corresponding semiconductor circuit structures dependent upon their respective application scenarios. For example, a CMOS logic circuit or a SRAM memory circuit typically includes a semiconductor structure of an active area, a gate and an STI. Referring to FIG. 2, the solid strip shape represents an active area, the oblique shadowed strip shape represents a gate, and the blank area between them represents an STI. A semiconductor device in a wafer to be subject to an annealing process includes an isolated area of active areas and gates (denoted by I in the Figure) and a dense area of active areas and gates (denoted by D in the Figure). Given the same annealing temperature of RTA radiation, the temperature of the wafer in the dense area D is relatively low due to high reflectivity with respect to RTA radiation, and on the contrary, the temperature of the wafer in the isolated area I is relatively high due to high absorptivity with respect to RTA radiation, thus giving rise to non-uniformity of an actual handling temperature of the semiconductor device on the wafer. In the embodiment, the STI distribution density is used to reflect distribution densities of the AA and the Ploy. Equivalently, the STI distribution density Dx is used to represent non-uniformity of the actual RTA temperature of the semiconductor device throughout the wafer, thereby allowing the possibility of taking a measure to improve the non-uniformity. Therefore, it is necessary to further derive a condition of the STI distribution density of the semiconductor device on the wafer, that is, to perform the following steps.

Step S2: The STI distribution density in a specific area of the semiconductor device and a target STI distribution density are derived.

Specifically, the semiconductor device is pre-divided into plural repeated specific areas, and then the active area distribution density $A_x$ and the gate distribution density $P_x$ in each of the specific areas are detected respectively; and the STI distribution density $D_x$ is calculated by the equation of $D_x = (1-A_x) \times (1-P_x)$.

Actually in the foregoing equation, $(1-A_x)$ represents transmissivity of the active area with respect to RTA radiation, and $(1-P_x)$ represents transmissivity of the gate structure with respect to RTA radiation. That is, the STI distribution density equals the product of the transmissivity of the active area with respect to RTA radiation and the transmissivity of the gate structure with respect to RTA radiation.

To derive the target STI distribution density, firstly the target electrical parameter is determined according to the design demand for the semiconductor device, and next the corresponding STI distribution density is derived from the ternary correspondence relationship among the electrical parameter, the annealing temperature, and the STI distribution density, which is established in the step S1. For example, the target STI distribution density $D_0$ corresponding to the target saturation current $I_{dsat}$ can be queried from FIG. 3.

Step S3: It is determined whether the STI distribution density in the specific area is larger than the target STI distribution density; and if the STI distribution density in the specific area is larger than the target STI distribution density, the flow proceeds to the step S4; otherwise the flow proceeds directly to the step S5.

Step S4: A virtual structure is added in the specific area to make the STI distribution density $D_x$ in the specific area equal to the target STI distribution density $D_0$, where the virtual structure includes at least a virtual active area or a virtual gate.

Figure 4:
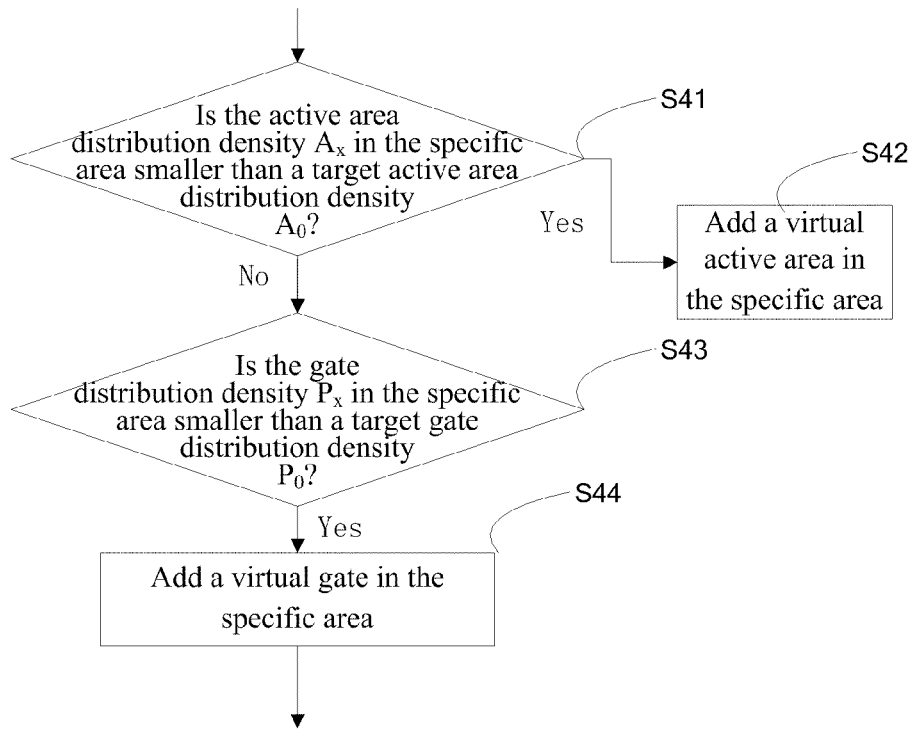
FIG. 4 is a flow chart illustrating steps of adding a virtual structure in a specific area according to an embodiment of the invention.

Specifically, the addition of the virtual structure in the specific area includes the following steps as illustrated in FIG. 4.

Step S41: It is determined whether the active area distribution density $A_x$ in the specific area is smaller than a target active area distribution density $A_0$; and if the active area distribution density $A_x$ in the specific area is smaller than the target active area distribution density $A_0$, the flow proceeds to the step S42; otherwise the flow proceeds to the step S43.

Step S42: A virtual active area is added in the specific area.

Step S43: It is determined whether the gate distribution density $P_x$ in the specific area is smaller than a target gate distribution density $P_0$. Then, the flow proceeds to the step S44.

Step S44: When the gate distribution density $P_x$ in the specific area is smaller than the target gate distribution density $P_0$, a virtual gate is added in the specific area.

In the foregoing steps S42 and S44, if there is already a virtual active area or a virtual gate in the specific area, the addition of the virtual active area may include increasing the pattern area of the original virtual active area or increasing the number of virtual active areas. As such, the addition of the virtual gate may include increasing the pattern area of the original virtual gate or increasing the number of virtual gates.

Figure 5:
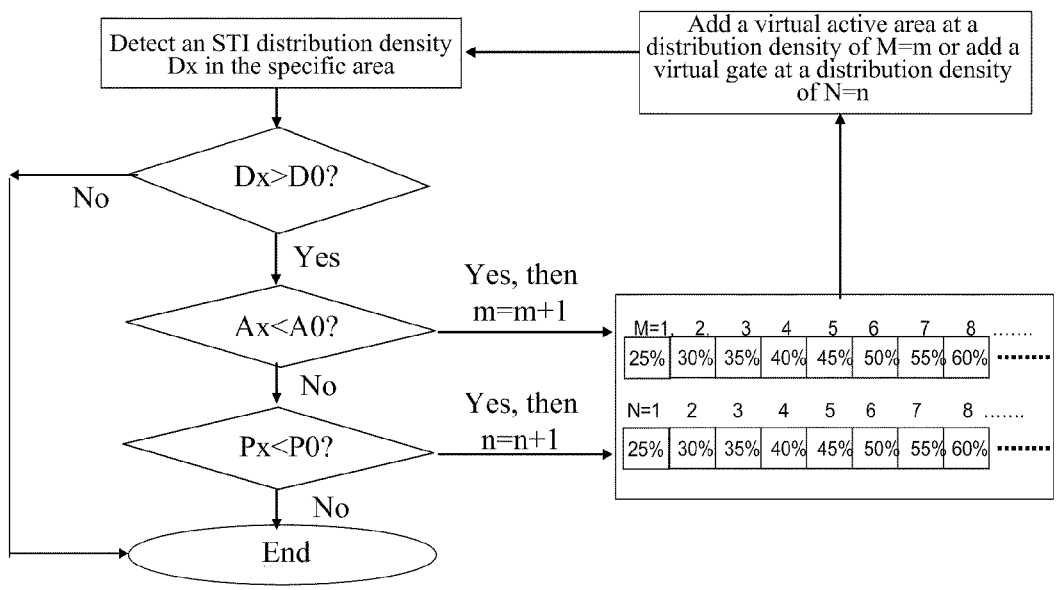
FIG. 5 is a flow chart illustrating adding a virtual structure in a specific area in a particular manner according to an embodiment of the invention.

Specifically, referring to FIG. 5, firstly the STI distribution density in the specific area is detected, it is determined whether $D_x$ is larger than $D_0$. If $D_x$ is larger than $D_0$, it is further determined whether $A_x$ is smaller than $A_0$. If $A_x$ is smaller than $A_0$, it indicates that the distribution density of the active area is low (with high transmissivity), and $A_x$ is increased gradually by a preset incremental level M until $D_x$ equals to $D_0$. If $A_x$ is larger than or equals to $A_0$, it is further determined whether $P_x$ is smaller than $P_0$. If $P_x$ is smaller than $P_0$, it indicates that the distribution density of the gate is low (with high transmissivity), and $P_x$ is increased gradually by a preset incremental level N until $D_x$ equals to $D_0$. Herein, M=1, 2, 3 . . . , and represents respectively 25%, 30%, 35% . . . of the distribution density of the virtual active area, and N=1, 2, 3 . . . , and represents respectively 25%, 30%, 35% . . . of the distribution density of the virtual gate.

Figure 6:
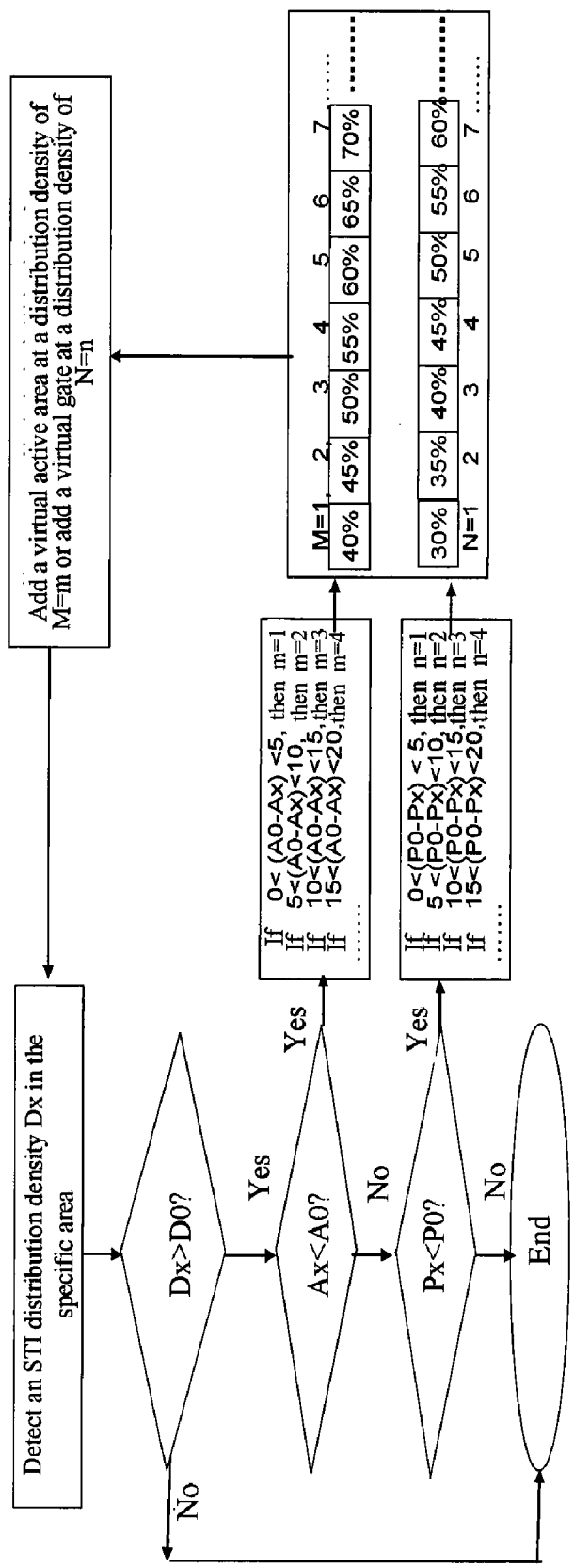
FIG. 6 is a flow chart illustrating adding a virtual structure in a specific area in another particular manner according to an embodiment of the invention.

In another embodiment, referring to FIG. 6, it differs from the embodiment of FIG. 5 in that if $A_x$ is smaller than $A_0$, firstly an incremental level corresponding to the difference between $A_0$ and $A_x$ is calculated, and then $A_x$ is increased gradually by a preset incremental level M. As such, if $P_x$ is smaller than $P_0$, firstly an incremental level corresponding to the difference between $P_0$ and $P_x$ is calculated, and then $P_x$ is increased gradually by a preset incremental level N.

In the embodiment, the virtual active area or the virtual gate refers to a virtual structure distributed in the wafer, which has the same semiconductor structure of a real circuit but is not provided with the function of the real circuit. For example, a virtual active area has the same doping concentration and depth and adopts the same fabrication process as a real active area, but is not connected with any metal contact plug and therefore is not provided with the conductivity function of the real active area.

Step S5: The target annealing temperature $T_0$ corresponding to the target STI distribution density $D_0$ is derived from the ternary correspondence relationship and is used to perform an annealing process on the semiconductor device throughout the wafer, thereby achieving the target electrical parameter, for example, the target saturation current $I_{dsat}$ illustrated in FIG. 3.

With the foregoing thermal rapid annealing method for a semiconductor device, the ternary correspondence relationship among the device electrical parameter, the annealing temperature, and the STI distribution density is established, firstly. Then, the concept of the STI distribution density is introduced to reflect the non-uniformity condition of an actual annealing process temperature of the semiconductor device throughout the wafer. Subsequently, a virtual structure is added in a specific area where the STI distribution density is larger than the target STI distribution density to thereby make the STI distribution density in the specific area equal to the target STI distribution density. From the ternary correspondence relationship, the target annealing temperature corresponding to the target STI distribution density is derived, and an annealing process is performed with the annealing temperature to thereby achieve the target electrical parameter. Thus, the same target STI distribution density in respective areas of the semiconductor device throughout the wafer can be ensured. Equivalently, substantially consistent absorptivity (or reflectivity or transmissivity) of the respective areas with respect to RTA radiation can be ensured. Therefore, a uniform actual RTA process temperature is achieved. Further, a uniform target electrical parameter is achieved. Therefore, the phenomenon of temperature non-uniformity of the rapid thermal annealing process can be improved to avoid any influence thereof upon the electrical performance of the semiconductor device.

In the foregoing embodiment, it is determined firstly whether $A_x$ is smaller than $A_0$ and then whether $P_x$ is smaller than $P_0$. In anther embodiment of the invention, the foregoing two steps can be reversed in order. Specifically, the addition of the virtual structure in the specific area includes the following steps:

It is determined whether the gate distribution density $P_x$ in the specific area is smaller than the target gate distribution density $P_0$;

If the gate distribution density $P_x$ in the specific area is smaller than the target gate distribution density $P_0$, a virtual gate is added in the specific area; otherwise, it is determined whether the active area distribution density $A_x$ in the specific area is smaller than the target active area distribution density $A_0$; and When the active area distribution density $A_x$ in the specific area is smaller than the target active area distribution density $A_0$, a virtual active area is added in the specific area.

The other steps are the same as those in the previous embodiment and repeated descriptions thereof will be omitted here.

The foregoing descriptions are merely the preferred embodiments of the invention but not intended in any way to limit the invention. In other embodiments of the invention, the electrical parameter can be another electrical parameter, e.g., a threshold voltage, etc., of the semiconductor device. In the present embodiment, the active area is a source or drain area of an MOS device, for example.

Although the invention has been disclosed as above in connection with the preferred embodiments thereof, the invention will not be limited thereto. Any skilled in the art can make numerous possible modifications and variations to the technical solution of the invention or derive equivalent embodiments thereof in light of the method as disclosed above without departing from the spirit of the invention. Accordingly, any modifications, variations or equivalents of the foregoing embodiments in light of the disclosure of the invention without departing from the spirit of the invention will fall into the scope of the invention.

The invention claimed is:

1. A rapid thermal annealing method for a semiconductor device, comprising the steps of:
   establishing a ternary correspondence relationship among a device electrical parameter, an annealing temperature, and a Shallow Trench Isolation (STI) distribution density;
   deriving an STI distribution density in a specific area of the semiconductor device and a target STI distribution density;
   determining whether the STI distribution density in the specific area is larger than the target STI distribution density;
   if the STI distribution density in the specific area is larger than the target STI distribution density, adding a virtual structure in the specific area to make the STI distribution density in the specific area equal to the target STI distribution density; and
   deriving from the ternary correspondence relationship a target annealing temperature corresponding to the target STI distribution density and performing an annealing process with the annealing temperature on the semiconductor device to achieve a target electrical parameter;

wherein the derivation of the STI distribution density in the specific area comprises the steps of:

pre-dividing the semiconductor device into a plurality of repeated specific areas;

detecting the active area distribution density $A_x$ and the gate distribution density $P_x$ in each of the specific areas; and calculating the STI distribution density $D_x$ by the equation of $D_x=(1-A_x)\times(1-P_x)$.

2. The method according to claim 1, wherein the virtual structure comprises at least a virtual active area and a virtual gate.

3. The method according to claim 2, wherein the addition of the virtual structure in the specific area comprises the steps of:

determining whether the active area distribution density in the specific area is smaller than a target active area distribution density;

if the active area distribution density in the specific area is smaller than the target active area distribution density, adding a virtual active area in the specific area; otherwise, determining whether the gate distribution density in the specific area is smaller than a target gate distribution density; and if the gate distribution density in the specific area is smaller than the target gate distribution density, adding a virtual gate in the specific area.

4. The method according to claim 2, wherein the addition of the virtual structure in the specific area comprises the steps of:

determining whether the gate distribution density in the specific area is smaller than a target gate distribution density; and if the gate distribution density in the specific area is smaller than the target gate distribution density, adding a virtual gate in the specific area; otherwise, determining whether the active area distribution density in the specific area is smaller than a target active area distribution density;

if the active area distribution density in the specific area is smaller than the target active area distribution density, then adding a virtual active area in the specific area.

5. The method according to claim 1, wherein the derivation of the target STI distribution density in the specific area of the semiconductor device comprises the steps of:

determining the target electrical parameter according to a design demand for the semiconductor device; and deriving, from the ternary correspondence relationship among the electrical parameter, the annealing temperature, and the STI distribution density, the target STI distribution density corresponding to the target electrical parameter.

6. The method according to claim 1, wherein the electrical parameter comprises a saturation current or a threshold voltage.

7. The method according to claim 1, wherein the annealing temperature is a peak annealing temperature.

8. The method according to claim 1, wherein the ternary correspondence relationship among the device electrical parameter, the annealing temperature, and the STI distribution density is a linear relationship.

9. The method according to claim 1, wherein the addition of the virtual structure comprises increasing the pattern number of virtual structures or the pattern area of an original virtual structure.

* * * * *